(12) United States Patent
Li et al.

(10) Patent No.: US 9,749,521 B2
(45) Date of Patent: Aug. 29, 2017

(54) IMAGE SENSOR WITH IN-PIXEL DEPTH SENSING

(71) Applicant: Apple Inc., Cupertino, CA (US)

(72) Inventors: Xiangli Li, Cupertino, CA (US); Terry L. Gilton, Boise, ID (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/266,898

(22) Filed: Sep. 15, 2016

(65) Prior Publication Data

US 2017/0006213 A1 Jan. 5, 2017

Related U.S. Application Data

(63) Continuation of application No. 14/198,540, filed on Mar. 5, 2014, now Pat. No. 9,451,152.

(60) Provisional application No. 61/785,920, filed on Mar. 14, 2013.

(51) Int. Cl.
*H04N 5/232* (2006.01)
*G03B 13/00* (2006.01)
*H01L 27/146* (2006.01)
*H04N 5/369* (2011.01)
*H04N 5/3745* (2011.01)
*H04N 9/083* (2006.01)
*H04N 3/14* (2006.01)
*H04N 5/335* (2011.01)
*H04N 9/04* (2006.01)

(52) U.S. Cl.
CPC ... *H04N 5/23212* (2013.01); *H01L 27/14609* (2013.01); *H01L 27/14621* (2013.01); *H01L 27/14623* (2013.01); *H01L 27/14645* (2013.01); *H04N 5/3696* (2013.01); *H04N 5/3745* (2013.01)

(58) Field of Classification Search
CPC .............. H04N 5/335; H01L 27/14643; H01L 27/14625; G02B 7/09; G02B 7/34; G02B 7/343
USPC .................................... 348/345–356
See application file for complete search history.

(56) References Cited

U.S. PATENT DOCUMENTS

| 8,305,483 | B2 | 11/2012 | Fujii et al. |
| 8,525,906 | B2 | 9/2013 | Ui |
| 2010/0013969 | A1 | 1/2010 | Ui |
| 2010/0214453 | A1 | 8/2010 | Murata |
| 2011/0085786 | A1 | 4/2011 | Tamaki |
| 2012/0044406 | A1 | 2/2012 | Shimoda et al. |
| 2012/0193515 | A1 | 8/2012 | Agranov et al. |
| 2013/0021499 | A1 | 1/2013 | Ui et al. |
| 2013/0182140 | A1 | 7/2013 | Yasuda |
| 2013/0194393 | A1 | 8/2013 | Sugie |

(Continued)

*Primary Examiner* — Kelly L Jerabek
(74) *Attorney, Agent, or Firm* — Brownstein Hyatt Farber Schreck, LLP

(57) ABSTRACT

An imaging area in an image sensor includes a plurality of photo detectors. A light shield is disposed over a portion of two photo detectors to partially block light incident on the two photo detectors. The two photo detectors and the light shield combine to form an asymmetrical pixel pair. The two photo detectors in the asymmetrical pixel pair can be two adjacent photo detectors. The light shield can be disposed over contiguous portions of the two adjacent photo detectors. A color filter array can be disposed over the plurality of photo detectors. The filter elements disposed over the two photo detectors can filter light representing the same color or different colors.

20 Claims, 8 Drawing Sheets

(56) References Cited

U.S. PATENT DOCUMENTS

2014/0028896 A1   1/2014   Oshima
2014/0267850 A1   9/2014   Li et al.

Angle Of Incident Light

IMAGE SENSOR WITH IN-PIXEL DEPTH SENSING

CROSS REFERENCE TO RELATED APPLICATIONS

This application is a continuation of U.S. patent application Ser. No. 14/198,540, filed Mar. 5, 2014, titled "Image Sensor with In-Pixel Depth Sensing," which claims the benefit under 37 C.F.R. §119(e) of U.S. Provisional Patent Application No. 61/785,920, filed on Mar. 14, 2013, entitled "Image Sensor With In-Pixel Depth Sensing," which is hereby incorporated by reference in its entirety.

TECHNICAL FIELD

The present invention relates generally to electronic devices, and more specifically, to image sensors for electronic devices.

BACKGROUND

Cameras and other image recording devices often use one or more image sensors, such as a charge-coupled device (CCD) image sensor or a complementary metal-oxide-semiconductor (CMOS) image sensor. When an image of a scene is captured, the scene can include objects that can be positioned or illuminated in a way that can make it difficult to represent the objects with acceptable detail. For example, an object can be positioned in a shadow, or two objects can be sufficiently far apart in distance that the camera is not able to focus on both objects adequately. This means one or both objects may be blurred in the image.

Depth of field is a term that can represent the distance between the nearest and farthest objects in a scene that appear acceptably sharp in an image. Typically, a camera may focus at only one distance, so the sharpness of objects located at different distances in the scene decrease on either side of the focused distance. If a camera is focused on an object in a scene that is near the camera, objects located farther away from the camera, or closer to the camera than the object, can be blurred in the image. Likewise, if a camera is focused on an object that is farther away from the camera, objects that are closer to the camera can be blurred in the image.

SUMMARY

Embodiments described herein may relate to or take the form of an imaging area in an image sensor includes a plurality of photo detectors. A light shield is disposed over a portion of two photo detectors to only partially block light incident on the two photo detectors. By way of example only, the portion of the two photo detectors covered by the light shield can be half of each of the two photo detectors. The two photo detectors can be two adjacent photo detectors, and the light shield can be disposed over contiguous portions of the two adjacent photo detectors.

Other embodiments may include a color filter array disposed over the plurality of photo detectors. The color filter array includes a plurality of filter elements and the filter elements disposed over the two photo detectors can filter light wavelengths representing the same color or different colors.

Further embodiments may include an imaging area in an image sensor which itself includes a plurality of pixels, where at least one pixel may be divided into two or more sub-pixel regions. Each sub-pixel can include a photo detector and a transfer transistor connected between the photo detector and a common node. A portion of the sub-pixels in the imaging area can be configured as asymmetrical photo detector pairs, where each asymmetrical photo detector pair includes two photo detectors and a light shield disposed over portions of the two photo detectors to partially block light received by each of the two photo detectors in the asymmetrical photo detector pair.

Other embodiments described herein may include or take the form of a method for determining a focus setting for an image capture device that may include includes an image sensor having an asymmetrical photo detector pair. The method can include the steps of capturing one or more images using a first focus setting and analyzing a first signal response output from each photo detector in the asymmetrical photo detector pair. A determination can be made as to whether a difference between the first signal responses is equal to or less than a threshold value. If the difference is less than or equal to the threshold value, an initial focus setting is set to the first focal setting. If the difference is greater than the threshold value, the method can repeat using different focus settings until a focus setting produces a difference in signal responses that equals or is less than the threshold value.

BRIEF DESCRIPTION OF THE DRAWINGS

Embodiments of the invention are better understood with reference to the following drawings. The elements of the drawings are not necessarily to scale relative to each other. Identical reference numerals have been used, where possible, to designate identical features that are common to the figures.

DETAILED DESCRIPTION

Figures 1A, 1B:
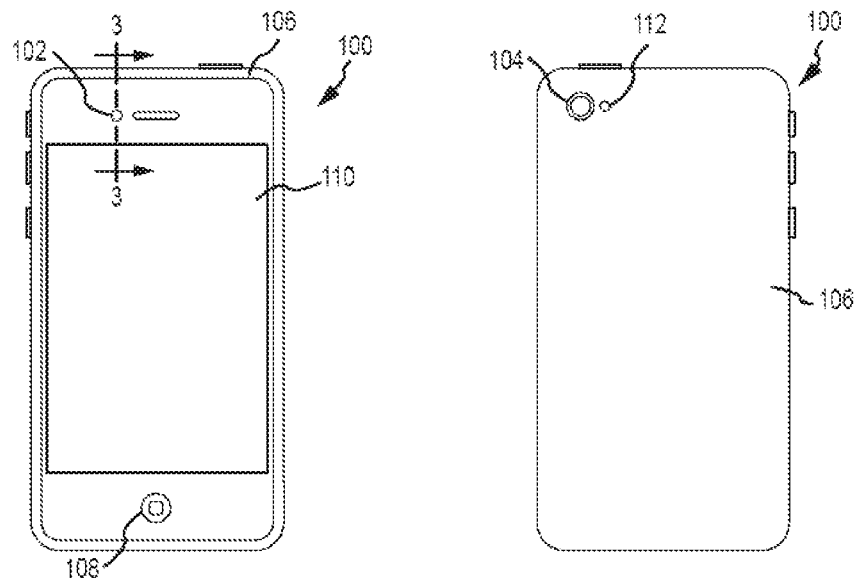
FIG. 1A depicts a front perspective view of an example electronic device including one or more cameras.
FIG. 1B depicts a rear perspective view of the example electronic device of FIG. 1A.

Embodiments described herein include an image sensor that is configured to provide depth of field information. The depth of field information can be used, for example, to determine an initial lens focus setting, to better focus one or more lenses when an image is captured, for gesture recognition, and in a three dimensional (3D) application. In one embodiment, an image sensor can operate in three different modes. One mode is a charge summing mode, another mode is a high dynamic range mode, and the third mode is a depth of field mode.

The pixels in an image sensor can be implemented as sub-pixels. For example, a pixel can be divided into four sub-pixels, where each sub-pixel can include a photo detector and a transfer transistor. The photo detectors accumulate charge in response to incident light. The transfer transistors in the four sub-pixels can be connected to a common sense region that is shared by the four sub-pixels. The gate of each transfer transistor can be independently pulsed to transfer accumulated charge from one or more photo detectors to the shared sense region. The accumulated charge in the one or more photo detectors can be transferred simultaneously, sequentially, or in groups. The charge on the shared sense region can then be read out.

In some embodiments, a color filter array can be disposed over an image sensor. The color filter array may be a mosaic of filter elements, where each filter element may be typically disposed over a pixel. Each filter element can restrict the wavelengths of light that strike a pixel. The light wavelengths can be restricted by color. For example, one filter element can transmit light wavelengths associated with the color red, another color filter element can transmit light wavelengths associated with the color green, and another color filter element can transmit light wavelengths associated with the color blue. When a pixel is configured into sub-pixels, the same filter element can be disposed over the sub-pixels in a pixel, allowing the sub-pixels to detect the same wavelengths of light (or color). The accumulated charge in two or more sub-pixels can be summed together by selectively pulsing the gates of the transfer transistors in the two or more sub-pixels. Thus, accumulated charge representing the same color can be summed together. Charge summing can, for example, improve the signal-to-noise ratio (SNR) of an image.

The dynamic range of an image sensor quantifies the ability of the image sensor to adequately image both high light areas in a scene and low dark areas or shadows in the scene. In general, the dynamic range of an image sensor may be less than that of the human eye. The limited dynamic range of an image sensor can result in an image losing details in the brighter areas or in the darker areas of the scene. A variety of algorithms have been produced to improve the dynamic range of image sensors. One such algorithm varies the integration times (the time light is collected) of the sub-pixels in the image sensor, which produces multiple images of a scene. For example, some sub-pixels can have a shorter integration time while other sub-pixels can have a longer integration time. The sub-pixels with the shorter integration time can better capture the brighter areas in a scene and the sub-pixels with the longer integration time can better capture darker areas in the scene. The image signals from sub-pixels having shorter and longer integration times can then be combined to produce a final high dynamic range image that has more detail in the lighter and in the darker areas of the image.

As described earlier, the embodiments described herein can provide an image sensor or image capture device that may be capable of operating in three different modes; a charge summing mode, a high dynamic range mode, and a depth of field information mode. The depth of field information can be obtained using one or more asymmetrical photo detector pairs included in an imaging area of an image sensor. Each asymmetrical photo detector pair includes two photo detectors and a light shield disposed over a portion of the two photo detectors to only partially block light that is incident on the two photo detectors. The signal responses produced by the two photo detectors in one or more asymmetrical photo detector pairs can be analyzed to determine a focus setting for an image capture device. A color filter array can be disposed over the imaging area. The filter elements disposed over the two photo detectors in each asymmetrical photo detector pair can filter light representing the same color or different colors.

Directional terminology, such as "top", "bottom", "front", "back", "leading", "trailing", etc., is used with reference to the orientation of the Figure(s) being described. Because components in various embodiments can be positioned in a number of different orientations, the directional terminology is used for purposes of illustration only and is in no way limiting. When used in conjunction with layers of an image sensor wafer, image sensor die, or corresponding image sensor, the directional terminology is intended to be construed broadly, and therefore should not be interpreted to preclude the presence of one or more intervening layers or other intervening image sensor features or elements. Thus, a given layer that is described herein as being formed on, formed over, disposed on, or disposed over another layer may be separated from the latter layer by one or more additional layers.

Referring now to FIGS. 1A-1B, there are shown front and rear perspective views of an electronic device that includes one or more cameras. The electronic device 100 includes a first camera 102, a second camera 104, an enclosure 106, a display 110, an input/output (I/O) member 108, and a flash 112 or light source for the camera or cameras. The electronic device 100 can also include one or more internal components (not shown) typical of a computing or electronic device, such as, for example, one or more processors, memory components, network interfaces, and so on.

In the illustrated embodiment, the electronic device 100 is implemented as a smart telephone. Other embodiments, however, are not limited to this construction. Other types of computing or electronic devices can include one or more cameras, including, but not limited to, a netbook or laptop computer, a tablet computer, a digital camera, a printer, a scanner, a video recorder, and a copier.

As shown in FIGS. 1A-1B, the enclosure 106 can form an outer surface or partial outer surface and protective case for the internal components of the electronic device 100, and may at least partially surround the display 110. The enclosure 106 can be formed of one or more components operably connected together, such as a front piece and a back piece. Alternatively, the enclosure 106 can be formed of a single piece operably connected to the display 110.

The I/O member 108 can be implemented with any type of input or output member. By way of example only, the I/O member 108 can be a switch, a button, a capacitive sensor, or other input mechanism. The I/O member 108 allows a user to interact with the electronic device 100. For example, the I/O member 108 may be a button or switch to alter the volume, return to a home screen, and the like. The electronic device can include one or more input members or output members, and each member can have a single I/O function or multiple I/O functions.

The display 110 can be operably or communicatively connected to the electronic device 100. The display 110 can be implemented with any type of suitable display, such as a high resolution display or an active matrix color liquid crystal display. The display 110 can provide a visual output for the electronic device 100 or function to receive user inputs to the electronic device. For example, the display 110 can be a multi-touch capacitive sensing touchscreen that can detect one or more user inputs.

Figure 2:
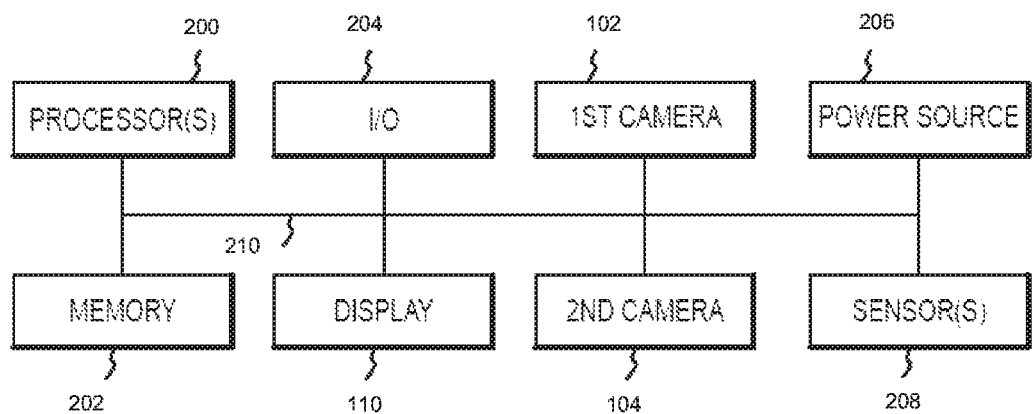
FIG. 2 depicts a simplified block diagram of the example electronic device of FIG. 1.

The electronic device 100 can also include a number of internal components. FIG. 2 illustrates one example of a simplified block diagram of the electronic device 100. The electronic device can include one or more processors 200, storage or memory components 202, input/output interface 204, power sources 206, and sensors 208, each of which will be discussed in turn below.

The one or more processors 200 can control some or all of the operations of the electronic device 100. The processor(s) 200 can communicate, either directly or indirectly, with substantially all of the components of the electronic device 100. For example, one or more system buses 210 or other communication mechanisms can provide communication between the processor(s) 200, the cameras 102, 104, the display 110, the I/O member 108, or the sensors 208. The processor(s) 200 can be implemented as any electronic device capable of processing, receiving, or transmitting data or instructions. For example, the one or more processors 200 can be a microprocessor, a central processing unit (CPU), an application-specific integrated circuit (ASIC), a digital signal processor (DSP), or combinations of multiple such devices. As described herein, the term "processor" is meant to encompass a single processor or processing unit, multiple processors, multiple processing units, or other suitably configured computing element or elements.

The memory 202 can store electronic data that can be used by the electronic device 100. For example, the memory 202 can store electrical data or content such as, for example, audio files, document files, timing signals, and image data. The memory 202 can be configured as any type of memory. By way of example only, memory 202 can be implemented as random access memory, read-only memory, Flash memory, removable memory, or other types of storage elements, in any combination.

The input/output interface 204 can receive data from a user or one or more other electronic devices. Additionally, the input/output interface 204 can facilitate transmission of data to a user or to other electronic devices. For example, in embodiments where the electronic device 100 is a smart telephone, the input/output interface 204 can receive data from a network or send and transmit electronic signals via a wireless or wired connection. Examples of wireless and wired connections include, but are not limited to, cellular, WiFi, Bluetooth, and Ethernet. In one or more embodiments, the input/output interface 204 supports multiple network or communication mechanisms. For example, the input/output interface 204 can pair with another device over a Bluetooth network to transfer signals to the other device while simultaneously receiving signals from a WiFi or other wired or wireless connection.

The power source 206 can be implemented with any device capable of providing energy to the electronic device 100. For example, the power source 206 can be a battery or a connection cable that connects the electronic device 100 to another power source such as a wall outlet.

The sensors 208 can by implemented with any type of sensors. Examples of sensors include, but are not limited to, audio sensors (e.g., microphones), light sensors (e.g., ambient light sensors), gyroscopes, and accelerometers. The sensors 208 can be used to provide data to the processor 200, which may be used to enhance or vary functions of the electronic device.

Figure 3:
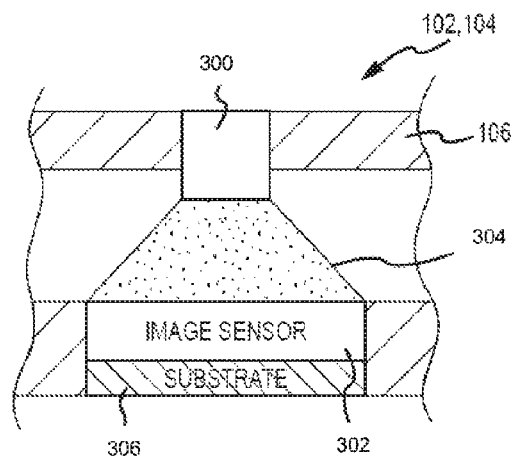
FIG. 3 depicts a cross-section view of the example electronic device of FIG. 1A taken along line 3-3 in FIG. 1A.

As described with reference to FIGS. 1A and 1B, the electronic device 100 includes one or more cameras 102, 104 and optionally a flash 112 or light source for the camera or cameras. FIG. 3 is a simplified cross-section view of the camera 102 taken along line 3-3 in FIG. 1A. Although FIG. 3 illustrates the first camera 102, those skilled in the art will recognize that the second camera 104 can be substantially similar to the first camera 102. In some embodiments, one camera may include a global shutter configured image sensor and one camera can include a rolling shutter configured image sensor. In other examples, one camera can include an image sensor with a higher resolution than the image sensor in the other camera.

The cameras 102, 104 include an imaging stage 300 that is in optical communication with an image sensor 302. The imaging stage 300 is operably connected to the enclosure 106 and positioned in front of the image sensor 302. The imaging stage 300 can include conventional elements such as a lens, a filter, an iris, and a shutter. The imaging stage 300 directs, focuses or transmits light 304 within its field of view onto the image sensor 302. The image sensor 302 captures one or more images of a subject scene by converting the incident light into electrical signals.

The image sensor 302 is supported by a support structure 306. The support structure 306 can be a semiconductor-based material including, but not limited to, silicon, silicon-on-insulator (SOI) technology, silicon-on-sapphire (SOS) technology, doped and undoped semiconductors, epitaxial layers formed on a semiconductor substrate, well regions or buried layers formed in a semiconductor substrate, and other semiconductor structures.

Various elements of imaging stage 300 or image sensor 302 can be controlled by timing signals or other signals supplied from a processor or memory, such as processor 200 in FIG. 2. Some or all of the elements in the imaging stage 300 can be integrated into a single component. Additionally, some or all of the elements in the imaging stage 300 can be integrated with image sensor 302, and possibly one or more additional elements of electronic device 100, to form a camera module. For example, a processor or a memory may be integrated with the image sensor 302 in embodiments.

Figure 4:
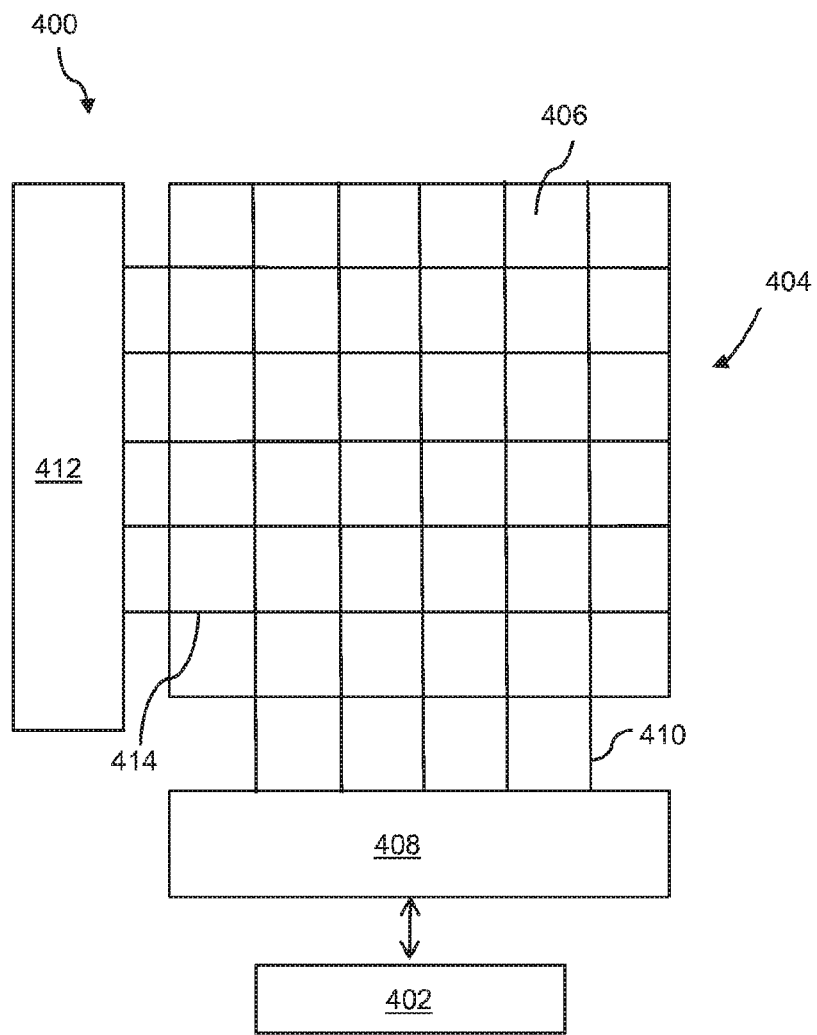
FIG. 4 depicts a simplified block diagram of one example of an image sensor that may be suitable for use as image sensor.

Referring now to FIG. 4, there is shown a top view of one example of an image sensor suitable for use as image sensor 302. The image sensor 400 can include an image processor 402 and an imaging area 404. The imaging area 404 is implemented as a pixel array that includes pixels 406. In the illustrated embodiment, the pixel array is configured in a row and column arrangement. However, other embodiments are not limited to this configuration. The pixels in a pixel array can be arranged in any suitable configuration, such as, for example, a hexagon configuration.

The imaging area 404 may be in communication with a column select 408 through one or more column select lines 410 and a row select 412 through one or more row select lines 414. The row select 412 selectively activates a particular pixel 406 or group of pixels, such as all of the pixels 406 in a certain row. The column select 408 selectively receives the data output from the select pixels 406 or groups of pixels (e.g., all of the pixels with a particular column).

The row select 412 and/or the column select 408 may be in communication with an image processor 402. The image processor 402 can process data from the pixels 406 and provide that data to the processor 200 and/or other components of the electronic device 100. It should be noted that in some embodiments, the image processor 402 can be incorporated into the processor 200 or separate therefrom.

Figure 5:
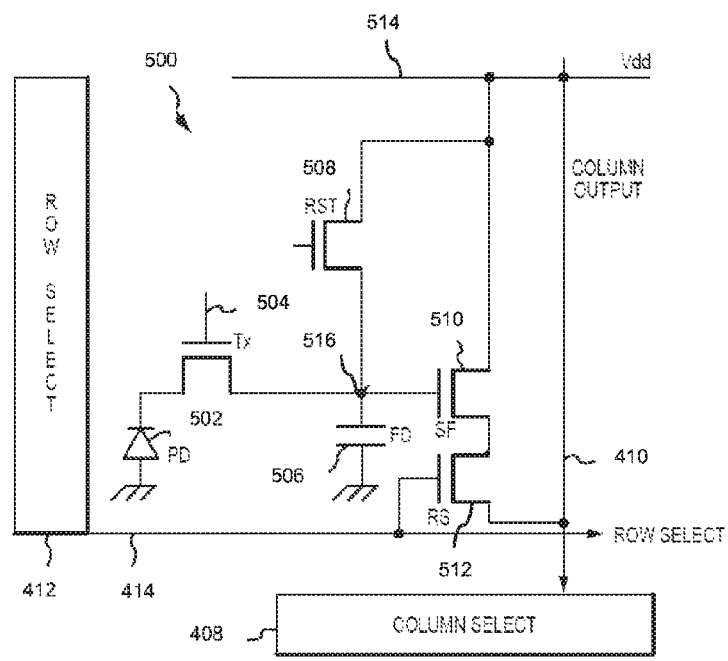
FIG. 5 depicts a simplified schematic view of a pixel that may be suitable for use in an image sensor.

Referring now to FIG. 5, there is shown a simplified schematic view of a pixel that is suitable for use as pixels 406. The pixel 500 includes a photo detector 502, a transfer transistor 504, a sense region 506, a reset (RST) transistor 508, a readout transistor 510, and a row select (RS) transistor 512. The sense region 506 is represented as a capacitor in the illustrated embodiment because the sense region 506 can temporarily store charge received from the photo detector 502. As described below, after charge is transferred from the photo detector 502, the charge can be stored in the sense region 506 until the gate of the row select transistor 512 is pulsed.

One terminal of the transfer transistor 504 is connected to the photo detector 502 while the other terminal is connected to the sense region 506. One terminal of the reset transistor 508 and one terminal of the readout transistor 510 are connected to a supply voltage (Vdd) 514. The other terminal of the reset transistor 508 is connected to the sense region 506, while the other terminal of the readout transistor 510 is connected to a terminal of the row select transistor 512. The other terminal of the row select transistor 512 is connected to an output line 410.

By way of example only, in one embodiment the photo detector 502 is implemented as a photodiode (PD) or pinned photodiode, the sense region 506 as a floating diffusion (FD), and the readout transistor 510 as a source follower transistor (SF). The photo detector 502 can be an electron-based photodiode or a hole based photodiode. It should be noted that the term photo detector as used herein is meant to encompass substantially any type of photon or light detecting component, such as a photodiode, pinned photodiode, photogate, or other photon sensitive region. Additionally, the term sense region as used herein is meant to encompass substantially any type of charge storing or charge converting region.

Those skilled in the art will recognize that the pixel 500 can be implemented with additional or different components in other embodiments. For example, a row select transistor can be omitted and a pulsed power supply mode used to select the pixel, the sense region can be shared by multiple photo detectors and transfer transistors, or the reset and readout transistors can be shared by multiple photo detectors, transfer gates, and sense regions.

When an image is to be captured, an integration period for the pixel begins and the photo detector 502 accumulates photo-generated charge in response to incident light. When the integration period ends, the accumulated charge in the photo detector 502 is transferred to the sense region 506 by selectively pulsing the gate of the transfer transistor 504. Typically, the reset transistor 508 is used to reset the voltage on the sense region 506 (node 516) to a predetermined level prior to the transfer of charge from the photo detector 502 to the sense region 506. When charge is to be readout of the pixel, the gate of the row select transistor is pulsed through the row select 412 and row select line 414 to select the pixel (or row of pixels) for readout. The readout transistor 510 senses the voltage on the sense region 506 and the row select transistor 512 transmits the voltage to the output line 410. The output line 410 is connected to readout circuitry and (optionally an image processor) through the output line 410 and the column select 408.

In some embodiments, an image capture device, such as a camera, may not include a shutter over the lens, and so the image sensor may be constantly exposed to light. In these embodiments, the photo detectors may have to be reset or depleted before a desired image is to be captured. Once the charge from the photo detectors has been depleted, the transfer gate and the reset gate are turned off, isolating the photo detectors. The photo detectors can then begin integration and collecting photo-generated charge.

Figure 6:
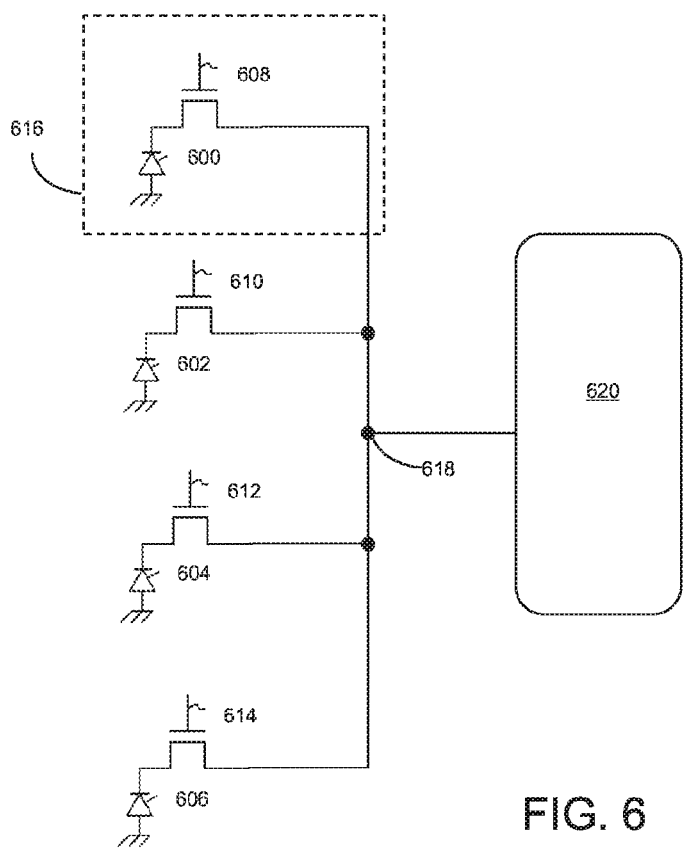
FIG. 6 depicts a simplified schematic view of one example of a sub-pixel arrangement that may be suitable for use in an image sensor.

FIG. 6 illustrates a simplified schematic view of one example of a sub-pixel arrangement suitable for use in an image sensor. Four photo detectors 600, 602, 604, 606 are each connected to a separate transfer transistor 608, 610, 612, 614. Each photo detector and associated transfer transistor can form one sub-pixel 616. Thus, there are four sub-pixels in the illustrated embodiment. The four sub-pixels 616 can represent a pixel in a pixel array in some embodiments. Other embodiments can have two or more sub-pixels represent a pixel.

The transfer transistors 608, 610, 612, 614 are each connected to a common node 618. Common node 618 can be implemented as the sense region 506 in FIG. 5. The common node is shared by the four sub-pixels 616.

Readout circuitry 620 can be connected to the common node 618. By way of example only, a sense region, a reset transistor, and a readout transistor can be included in the readout circuitry 620 and can be configured as shown in FIG. 5. The sense region, the reset transistor and the readout transistor can be connected to the common node 618. A row select transistor can be connected to the readout transistor.

The gates of each transfer transistor 608, 610, 612, 614 can be selectively pulsed in one embodiment, allowing charge from one or more photo detectors to transfer to the common node 618. Thus, the sub-pixels 616 can provide a charge summing mode. Since the transfer transistors 608, 610, 612, 614 can each be selectively pulsed, the charge from one, two, three, or four photo detectors can be transferred separately, in combinations, or simultaneously. For example, the charge from photo detectors 600 and 604 can be summed together prior to readout by separately or simultaneously pulsing the gates of the respective transfer transistors 608 and 612, thereby transferring the charge to the common node 618. In one embodiment, charge from multiple sub-pixels that represents a single color is summed together (e.g., charge from two red sub-pixels is summed). The summed charge can then be readout using some or all of the components in the readout circuitry 616.

An image sensor that includes the sub-pixels 616 can operate in a high dynamic range mode. For example, in the illustrated embodiment the photo detectors in two sub-pixels can have a first integration time while the photo detectors in the other two sub-pixels can have a different second integration time. When the first integration time is shorter than the second, the sub-pixels with the first integration time can better capture the brighter areas in a scene and the sub-pixels with the second integration time can better capture darker areas in the scene. The charge from the two sub-pixels with the first integration time can be summed together by selectively transferring the accumulated charge in the photo detectors to the common node 618 and then reading the charge out using some or all of the components in the readout circuitry 616. Likewise, the charge from the two sub-pixels with the second integration time can be summed together by selectively transferring the accumulated charge in the photo detectors to the common node 618 and then reading out the summed charge. A final high dynamic range image can be obtained by combining or stitching both images together.

An image sensor can be constructed on a single semiconductor-based wafer or on multiple semiconductor-based wafers. When a single wafer is used, the components in each pixel reside in or on the single wafer. When multiple wafers are used, the components in each pixel can be divided between two or more wafers. For example, in the embodiment illustrated in FIG. 5, the photo detectors and the transfer transistors can reside on one wafer and the sense regions, reset transistors, readout transistors and row select transistors on a different wafer. Alternatively, with the FIG. 6 embodiment, the photo detectors and the transfer transistors can reside on a first wafer and the common sense region on a second wafer. The reset, readout, and row select transistors can also be formed in or on the second wafer and can be shared by two or more photo detectors on the first wafer. An interconnect layer is typically used to electrically connect the transfer transistors to the sense region or regions.

In general, photo detectors detect light with little or no wavelength specificity, making it difficult to identify or separate colors. When color separation is desired, a color filter array can be disposed over the imaging area to filter the wavelengths of light sensed by the photo detectors in the imaging area. A color filter array is a mosaic of color filters with each color filter typically disposed over a respective pixel. Each color filter restricts the wavelengths of light detected by the photo detector, which permits color information in a captured image to be separated and identified.

Figure 7:
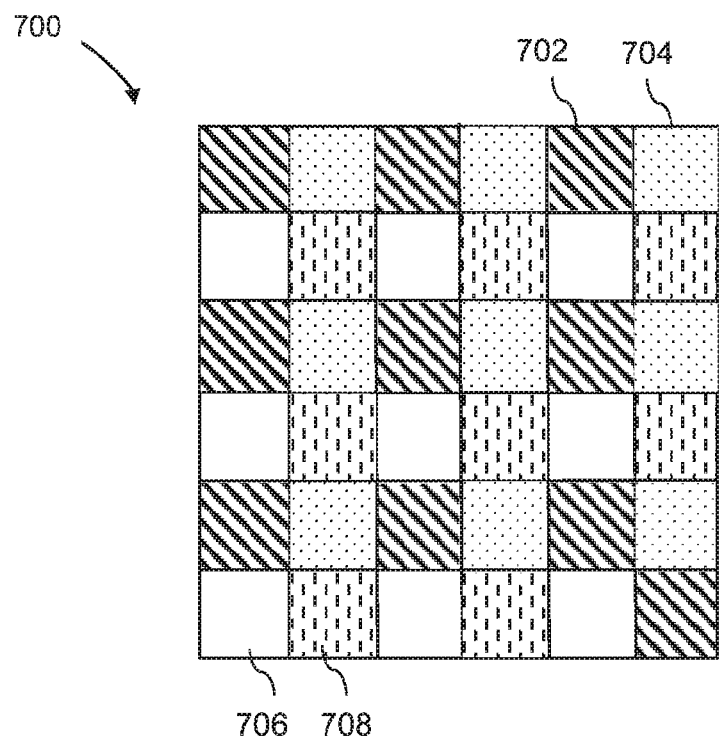
FIG. 7 depicts an example color filter array that may be suitable for use with an image sensor having pixels configured as shown in FIG. 5.

FIG. 7 depicts one color filter array suitable for use with an image sensor having pixels configured as shown in FIG. 5. The color filter array (CFA) 700 includes filter elements 702, 704, 706, 708. Although only a limited number of color filters are shown, those skilled in the art will recognize that a color filter can include thousands or millions of color filters.

In one embodiment, each filter element restricts light wavelengths. In another embodiment, some of the filter elements filter light wavelengths while other filter elements are panchromatic. A panchromatic color filter can have a wider spectral sensitivity than the spectral sensitivities of the other color filters in the CFA. For example, a panchromatic filter can have a high sensitivity across the entire visible spectrum. A panchromatic filter can be implemented, for example, as a neutral density filter or a color filter. Panchromatic filters can be suitable in low level lighting conditions, where the low level lighting conditions can be the result of low scene lighting, short exposure time, small aperture, or other situations where light is restricted from reaching the image sensor.

Figure 8:
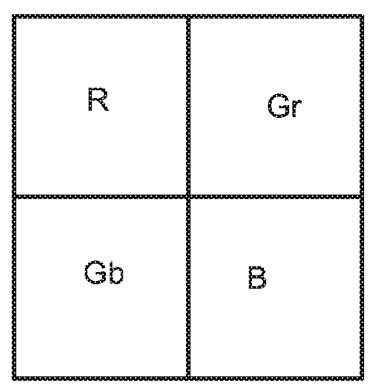
FIG. 8 depicts a Bayer color filter array pattern.

Color filter arrays can be configured in a number of different mosaics. The color filter array 700 can be implemented as a red (R), green (G), and blue (B) color filter array or a cyan (C), magenta (M), yellow (Y) color filter array. The Bayer pattern is a well know color filter array pattern. The Bayer color filter array filters light in the red (R), green (G), and blue (B) wavelengths ranges (see, e.g., FIG. 8). The Bayer color filter pattern includes two green color filters (Gr and Gb), one red color filter, and one blue color filter. The group of four color filters is tiled or repeated over the pixels in an imaging area to form the color filter array.

Figures 9, 10:
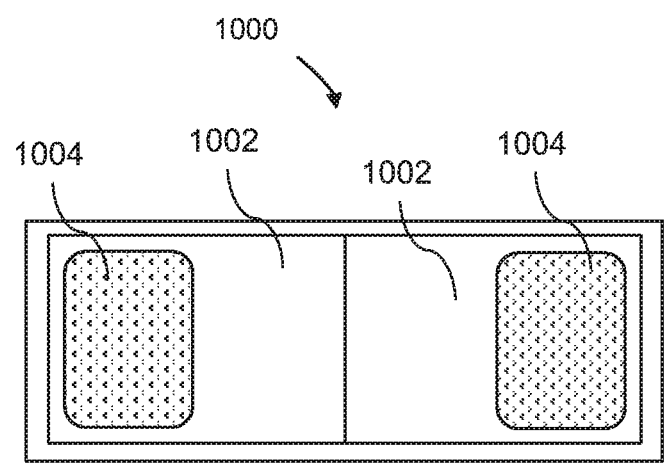
FIG. 9 depicts a color filter array that may be suitable for use with an image sensor having sub-pixels configured as shown in FIG. 6.
FIG. 10 depicts a top view of an example asymmetrical photo detector pair.

FIG. 9 illustrates a color filter array suitable for use with an image sensor having sub-pixels configured as shown in FIG. 6. Each color filter is divided into four sub-color filters C1, C2, C3, C4, and each sub-color filter is disposed over a photo detector in a sub-pixel. Thus, in the FIG. 6 embodiment, the four sub-pixels detect light associated with the same color. The charge in two or more photo detectors can be summed together, thereby allowing charge representing the same color to be summed. For example, the charge in the photo detectors covered by filter elements C1 and C4 can be summed together, and the charge in the photo detectors covered by filter elements C2 and C3 can be summed together.

As described earlier, the sub-pixels can permit an image sensor to be configured with different operating modes. One mode is a charge summing mode. Another mode is a high dynamic range mode. Turning to the embodiment illustrated in FIG. 9, a high dynamic range mode can provide a first integration period to the photo detectors associated with filter elements C1 and C4. The photo detectors associated with filter elements C2 and C3 can have a second different integration time. Because the photo detectors with the first integration time are diagonally opposed to each other, and the photo detectors with the second integration time are diagonally opposed to each other, the images captured by the four photo detectors can have the same center of gravity. Additionally, the spatial resolution in both the horizontal and vertical directions can be the same in the final high dynamic range image, thereby reducing or eliminating spatial artifacts.

Referring now to FIG. 10, there is shown a top view of an asymmetrical photo detector pair. The pair 1000 includes two adjacent sub-pixels in one embodiment. The sub-pixels can be vertically or horizontally adjacent. Portions 1002 of the photo detectors are covered by a light shield (not shown) and portions 1004 of the photo detectors are not covered by the light shield. The portions 1004 of the photo detectors that are not covered by the light shield are able to detect light, so the light shield may only partially block incident light on the photo detectors.

Figure 11:
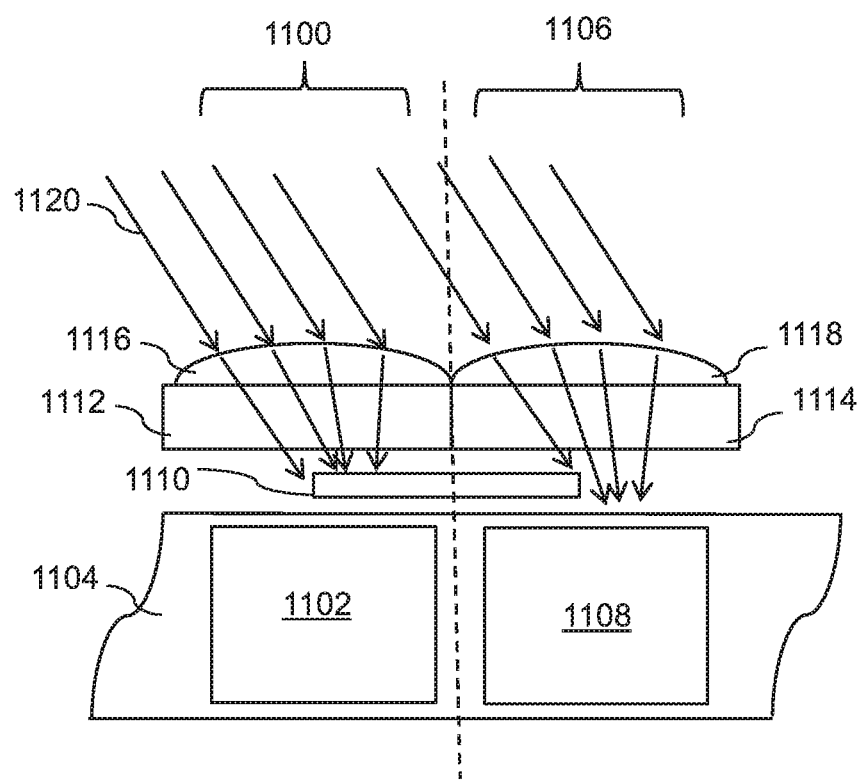
FIG. 11 depicts a simplified cross-sectional view of the example asymmetrical photo detector pair shown in FIG. 10.

FIG. 11 illustrates a simplified cross-sectional view of the asymmetrical photo detector pair shown in FIG. 10. One sub-pixel 1100 includes a photo detector 1102 formed in a substrate 1104. The substrate can be a semiconductor-based material similar to those described in conjunction with the support structure 306 in FIG. 3. Another sub-pixel 1106 includes a photo detector 1108 formed in the substrate 1104. A light shield 1110 is disposed over portions of both of the photo detectors 1102, 1108. The light shield 1110 can be made of any opaque material or combination of materials, including, but not limited to, a metal.

In the illustrated embodiment, the light shield 1110 is disposed over contiguous portions of the photo detectors. Other embodiments are not limited to this construction. The light shield 1110 can cover different non-contiguous portions of the photo detectors. The light shield can be disposed over any given portion of the photo detectors. For example, the light shield can be disposed over half of each photo detector.

Additionally, each asymmetrical photo detector pair in an imaging area can be identical or some of the asymmetrical photo detector pairs can differ from other asymmetrical photo detector pairs in an imaging area. By way of example only, the light shield in some of the asymmetrical photo detector pairs can be disposed over half of the photo detectors while the light shield in other asymmetrical photo detector pairs can cover a third of the photo detectors.

Filter elements 1112, 1114 are disposed over the photo detectors 1102, 1108, respectively. The filter elements 1112, 1114 can filter light wavelengths that represent the same or different colors. A microlens 1116, 1118 is disposed over each filter element 1112, 1114. The microlenses 1116, 1118 are configured to focus incident light 1120 onto respective photo detectors 1102, 1108. The light 1120 is angled from the left in the illustrated embodiment. The light shield 1110 blocks some or all of the light 1120 received by the sub-pixel 1100, thereby preventing the photo detector 1102 from detecting all of the light that would be incident on the photo detector 1102 if the light shield were not present. Similarly, the light shield 1110 blocks some or all of the light 1120 received by the sub-pixel 1102, thereby preventing the photo detector 1108 from detecting all of the light that would be incident on the photo detector 1108 if the light shield were not present. Due to the direction and angle of the light 1120 and the light shield 1110, the photo detector 1108 can detect more light 1120 than the photo detector 1102. Thus, the photo detector 1108 can accumulate more charge than the photo detector 1102, making the signal response of the sub-pixel 1106 higher than the signal response of the sub-pixel 1100.

When the light 1120 is angled from the right (not shown), the signal response of the sub-pixel 1100 can be higher than the signal response of the sub-pixel 1106. And when the light is perpendicular to the surface of the substrate 1104, partial light will be blocked on both sub-pixels 1100, 1106, and the signal responses of both sub-pixels 1100, 1106 can be substantially the same. Object phase information can be obtained by analyzing the signal responses of the sub-pixels in the asymmetrical pair. The object phase information can be used to provide information about the field depth.

Figure 12:
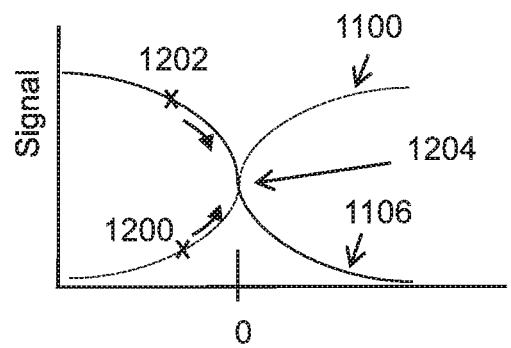
FIG. 12 depicts an example of angular signal responses of the asymmetrical photo detector pair shown in FIG. 11.

FIG. 12 illustrates an example of angular signal responses of the asymmetrical photo detector pair shown in FIG. 11. Since the light shield 1110 in the FIG. 11 embodiment is symmetrical and the light shield is disposed over half of each photo detector 1102, 1108, the two signal responses are both shaped and are reversed with respect to each other (i.e., mirror images), and the two signal responses intersect at the point 1204 when the angle of incident light is substantially zero. Other embodiments can shape the signal responses differently.

A focus setting can be determined for an image or images by analyzing the differences between the signal responses produced by the asymmetrical photo detector pair. For example, the lens can be positioned or moved to find the optimum focal spot for the remaining sub-pixels in a pixel or for a pixel. When a lens is not properly focused, the signal levels obtained from each sub-pixel can be plotted on a respective signal response. The position of the lens can then be changed to cause the signal levels plotted on the signal responses to be located at the intersection point 1204. For example, points 1200, 1202 represent signal response levels obtained from the sub-pixels 1100, 1106. The lens of an image capture device can be adjusted so that the signal response levels obtained from the sub-pixels move on or near the intersection point 1204.

Figure 13:
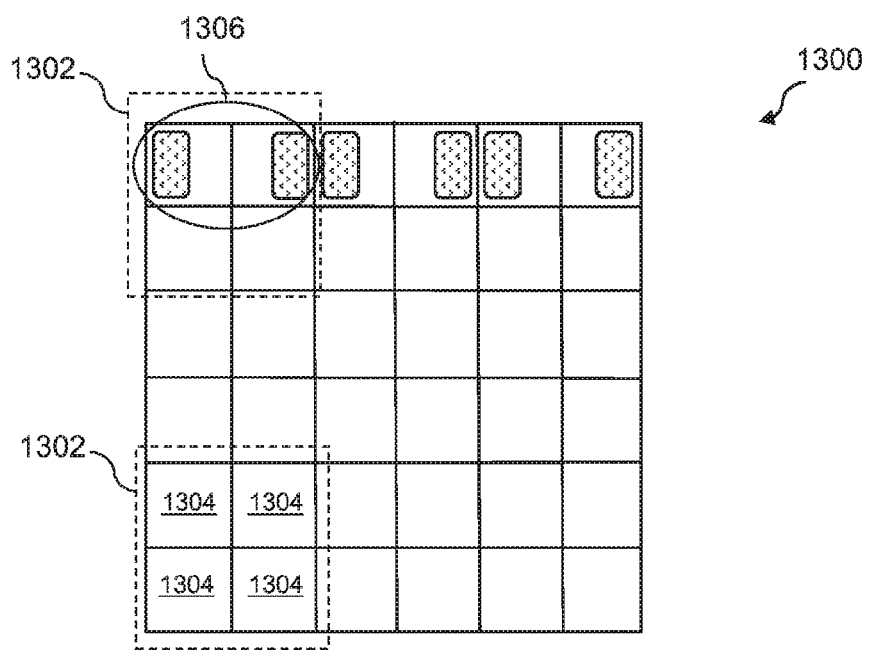
FIG. 13 depicts a simplified top view of an example image sensor showing one arrangement of asymmetrical photo detector pairs.

Referring now to FIG. 13, there is shown a simplified top view of an imaging area showing one arrangement of asymmetrical photo detector pairs. The imaging area 1300 includes pixels 1302 that are each divided into four sub-pixels 1304. The pixels are arranged in rows and columns, and in one embodiment one or more rows can include asymmetrical photo detector pairs 1306. In another embodiment, one or more columns can include the asymmetrical photo detector pairs.

As described earlier, since each photo detector in a sub-pixel can be connected to a transfer gate, the asymmetrical photo detector pairs 1306 can be read out separately from the other sub-pixels 1304 in a pixel 1302. When the imaging area 1300 will be used to capture a high dynamic range image, the charge produced from the other sub-pixels in a pixel that includes an asymmetrical photo detector pair is read out and used to produce the final high dynamic range image. One of the sub-pixels readout can have a first integration time and the other sub-pixel can have a different second integration time. Since the locations of the asymmetrical photo detector pairs are known, the final high dynamic range image can be obtained by scaling (e.g., multiply by 2) the charge or image signal readout from the two sub-pixels in the pixels having asymmetrical photo detector pairs. By way of example only, the scaling can be performed in the digital domain with the imaging domain for image reconstruction.

One or more embodiments can include the asymmetrical photo detector pairs in an entire row or column of an imaging area or in selected locations in the imaging area. An imaging area can include any number of rows or columns or select locations of asymmetrical photo detector pairs. By way of example only, ten or twenty rows or columns can include asymmetrical photo detector pairs.

Figure 14:
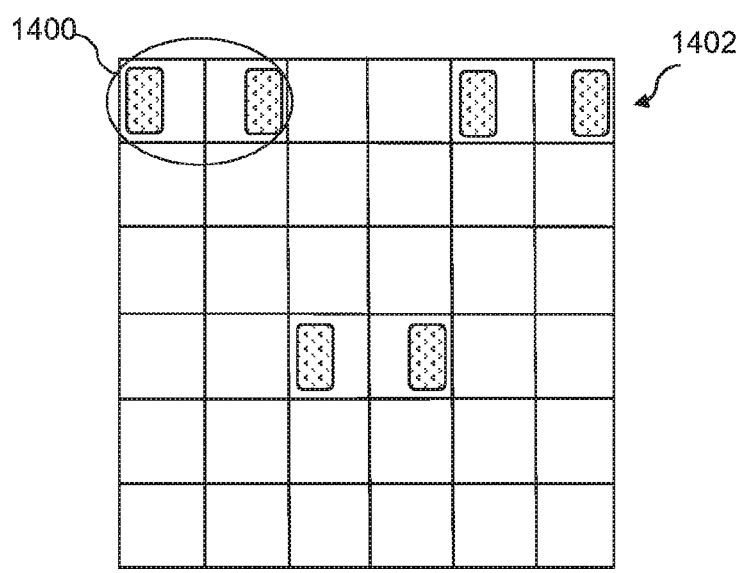
FIG. 14 depicts a simplified top view of an example image sensor showing another arrangement of asymmetrical photo detector pairs.

FIG. 14 illustrates a simplified top view of an image sensor showing another arrangement of asymmetrical photo detector pairs. The asymmetrical photo detector pairs 1400 are positioned at select locations in an imaging area 1402. The charge in the asymmetrical photo detector pairs can be readout separately from the other sub-pixels when depth information is to be determined. The charge in the asymmetrical photo detector pairs may not be read out when a high dynamic range image is to be produced.

Figure 15:
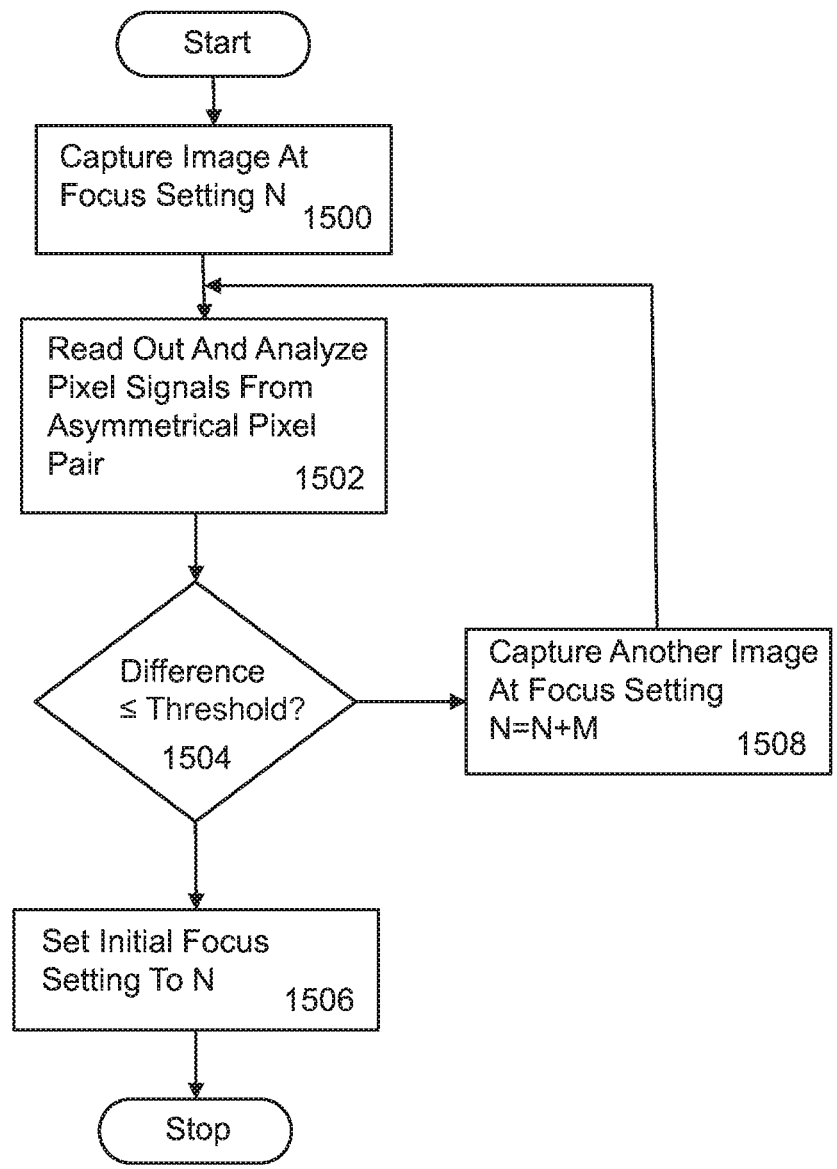
FIG. 15 depicts an example flowchart of a method for determining an initial focus setting for an image capture device.

Referring now to FIG. 15, there is shown a flowchart of a method for determining an initial focus setting for an image capture device. Initially, an image is captured by the pixels or sub-pixels in an imaging area using a focus setting of N. N can be any given focus setting. The charge in one or more asymmetrical photo detector pairs is readout and the signal responses are analyzed (block 1502). The signal responses can be analyzed, for example, as described in conjunction with FIG. 12.

A determination is then made at block 1504 as to whether a difference between the signal responses output from at least one asymmetrical photo detector pair is equal to or less than a threshold value. For example, the threshold value can be a range or a percentage that defines an acceptable difference between the two signal responses. If the difference between the signal responses is equal to or less than the threshold value, an initial focus setting is set to setting N (block 1506). The initial focus setting can be used to capture one or more images.

If however, the difference between the signal responses is greater than the threshold value, focus setting N is changed to another setting value N=N+M (block 1508). M can be any given number, thereby allowing the focus setting to increase or decrease sequentially or by a certain number of settings. The change in the focus setting (increase or decrease) can be based on the analysis of the signal responses and the directions of change needed to bring the signal responses near or at the intersection point. The method then returns to block 1502 and repeats until the difference in the signal responses is equal or less than the threshold value.

The process illustrated in FIG. 15 can be performed at any time. For example, a camera can perform the method when the camera is first powered on. Additionally or alternatively, a camera can perform the processes at predetermined times or at selected times. For example, a user can interact with an input device, such as an icon on a display screen, to instruct the camera to perform the method.

The embodiments described herein can provide an image sensor or image capture device that is capable of operating in three different modes; a charge summing mode, a high dynamic range mode, and a depth of field information mode. The depth of field information can be obtained using one or more asymmetrical photo detector pairs included in an imaging area of an image sensor. Each asymmetrical photo detector pair includes two photo detectors and a light shield disposed over a portion of the two photo detectors to partially block light that is incident on the two photo detectors. The signal responses produced by the two photo detectors in one or more asymmetrical photo detector pairs can be analyzed to determine a focus setting for an image capture device. A color filter array can be disposed over the imaging area. The filter elements disposed over the two photo detectors in each asymmetrical photo detector pair can filter light representing the same color or different colors.

Various embodiments have been described in detail with particular reference to certain features thereof, but it will be understood that variations and modifications can be effected within the spirit and scope of the disclosure. For example, the embodiments described herein have described the asymmetrical photo detector pairs as being constructed in a sub-pixel. Other embodiments can locate the asymmetrical photo detector pairs in pixels in an imaging area, where each pixel includes a photo detector and a transfer gate. FIG. 5 illustrates an example of such pixels.

And even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

We claim:

1. An image capture system, comprising:
an image sensor comprising a plurality of pixels, at least one pixel comprising:
  a first sub-pixel comprising a first photodetector;
  a second sub-pixel adjacent the first sub-pixel, the second sub-pixel comprising a second photodetector separated from the first photodetector by a boundary;
  a third sub-pixel comprising a third photodetector; and
  a fourth sub-pixel comprising a fourth photodetector;
a light shield disposed above the imaging area and positioned to overlap the boundary and a portion of the first photodetector and the second photodetector; and
a processor in communication with the imaging area and configured to:
  receive a first signal from the first photodetector and a second signal from the second photodetector in response to a first focus setting of the image sensor;
  change the first focus setting to a second focus setting upon determining that a difference between the first signal and the second signal is greater than a threshold value;
  receive a third signal from the third photodetector and a fourth signal from the fourth photodetector, the third and the fourth signals obtained during an image capture; and
  scale the third signal and the fourth signal to produce an image obtained during the image capture.

2. The image capture system of claim 1, wherein:
the third signal is obtained using a first integration time; and
the fourth signal is obtained using a second integration time.

3. The image capture system of claim 1, wherein the third signal and the fourth signal are scaled by a same value.

4. The image capture system of claim 1, wherein:
the third signal is scaled by a first value; and
the fourth signal is scaled by a second value.

5. The image capture system of claim 1, wherein the portion of the first photodetector and the second photodetector overlapped by the light shield comprises half of an area of each of the first photodetector and the second photodetector.

6. The image capture system of claim 1, further comprising:
a first transfer transistor operably connected to the first photodetector;
a second transfer transistor operably connected to the second photodetector;
a third transfer transistor operably connected to the third photodetector; and
a fourth transfer transistor operably connected to the fourth photodetector.

7. The image capture system of claim 6, wherein the third and the fourth transfer transistors are connected to a common node.

8. The image capture system of claim 1, further comprising a color filter array disposed over the imaging area, wherein a filter element in the color filter array is disposed over the first, the second, the third, and the fourth photodetectors.

9. The image capture system of claim 8, wherein the filter element filters light representing a single color.

10. An electronic device, comprising:
an image sensor comprising:
  an asymmetric pixel pair comprising:
    a first photodetector adjacent to a second photodetector; and
    a light shield layer positioned to overlap a portion of the first photodetector and the second photodetector;
  a first pixel comprising a third photodetector and a first transfer transistor operably connected to the first photodetector; and
  a second pixel comprising a fourth photodetector and a second transfer transistor operably connected to the second photodetector, wherein the first and the second photodetectors are operably connected to a common node; and
a processor in communication with the imaging area and configured to:
  obtain a first signal from the first photodetector and a second signal from the second photodetector based on a first focus setting of the image sensor;
  change the first focus setting to a second focus setting upon determining that a difference between the first signal and the second signal is greater than a threshold value;
  obtain a third signal from the third photodetector after a first integration time; and
  receive a fourth signal from the fourth photodetector after a different second integration time;
  scale the third signal and the fourth signal; and
  generate an image using the scaled third and fourth signals.

11. The electronic device of claim 10, wherein the processor generates the image by:
- causing charge in the third photodetector to be transferred to the common node using the first transfer transistor;
- causing charge in the fourth photodetector to be transferred to the common node using the second transfer transistor; and
- causing a summed signal to be read from the common node.

12. The electronic device of claim 10, wherein the light shield layer is disposed over neighboring portions of the first and the second photodetectors.

13. The electronic device of claim 12, wherein the neighboring portions of the first and the second photodetectors comprise at least half of a surface area of the first and the second photodetectors.

14. The electronic device of claim 10, further comprising a color filter array that includes a first color filter element disposed over the third photodetector and a second color filter element disposed over the fourth photodetector, wherein the first and the second color filter elements filter light representing a same color.

15. A method for operating an image sensor having an asymmetrical pixel pair, a first imaging pixel, and a second imaging pixel, the method comprising:
- capturing an image using a first focus setting;
- analyzing a first signal received from a first photodetector in the asymmetrical pixel pair;
- analyzing a second signal received from a second photodetector in the asymmetrical pixel pair;
- determining if a difference between the first and the second signals is equal to or less than a threshold value;
- if the difference between the first and the second signals is greater than the threshold value, changing the first focus setting to a second focus setting; and
- capturing a second image, comprising:
  - receiving a third signal from the first imaging pixel, wherein the third signal is based on a first integration time of the first imaging pixel;
  - receiving a fourth signal from the second imaging pixel, wherein the fourth signal is based on a different second integration time; and
  - generating the second image from the third signal and the fourth signal.

16. The method of claim 15, wherein:
the third signal is scaled using a first value; and
the fourth signal is scaled using a second value.

17. The method of claim 15, wherein the third signal and the fourth signal are scaled by a same value.

18. The method of claim 15, wherein:
- receiving the third signal comprises transferring charge from the first imaging pixel to a common node using a first transfer transistor;
- receiving the fourth signal comprises transferring charge from the second imaging pixel to the common node using a second transfer transistor; and
- generating the second image comprises reading a summed signal from the common node.

19. The method of claim 15, wherein
- the second image is captured using the second focus setting when the difference between the first and the second signals is greater than the threshold value; and
- the second image is captured using the first focus setting when the difference between the first and the second signals is less than the threshold value.

20. The method of claim 15, further comprising prior to capturing the second image:
- repeatedly capturing one or more images using a different focus setting;
- analyzing the first and the second signals; and
- determining if a difference between the first and the second signals is equal to or less than a threshold value until the difference between the first and the second signals is equal to or less than the threshold value, wherein the second focus setting is set to a focus setting associated with the difference between the first and the second signals being equal to or less than the threshold value.

* * * * *